United States Patent [19]
Bohnenkamp et al.

[11] Patent Number: 6,046,457
[45] Date of Patent: Apr. 4, 2000

[54] CHARGED PARTICLE BEAM APPARATUS HAVING ANTICONTAMINATION MEANS

[75] Inventors: Carl E. Bohnenkamp; Chester T. Dziobkowski, both of Hopewell Junction, N.Y.

[73] Assignee: International Business Machines Corporation, Armonk, N.Y.

[21] Appl. No.: 09/005,612

[22] Filed: Jan. 9, 1998

[51] Int. Cl.[7] .......................... G01N 21/00; G01N 23/00
[52] U.S. Cl. .................. 250/443.11; 250/398; 250/397
[58] Field of Search ................................ 250/443.1, 398, 250/397, 492.2, 310

[56] References Cited

U.S. PATENT DOCUMENTS

| | | |
|---|---|---|
| 3,008,044 | 11/1961 | Buchhold . |
| 3,558,878 | 1/1971 | Neuhaus . |
| 3,624,390 | 11/1971 | Watanabe .............................. 250/443.1 |
| 3,916,201 | 10/1975 | Herrmann et al. . |
| 4,179,605 | 12/1979 | Watanabe et al. . |
| 4,214,166 | 7/1980 | Dietrich et al. .......................... 250/397 |
| 4,667,108 | 5/1987 | Walker et al. ........................... 250/398 |
| 4,766,313 | 8/1988 | Homma et al. ....................... 250/443.1 |
| 4,803,369 | 2/1989 | Otaka . |
| 4,833,330 | 5/1989 | Swann et al. . |
| 5,355,683 | 10/1994 | Taylor . |
| 5,435,379 | 7/1995 | Moslehi et al. . |
| 5,510,624 | 4/1996 | Zaluzec . |
| 5,539,211 | 7/1996 | Ohtoshi et al. . |
| 5,577,552 | 11/1996 | Ebinuma et al. . |

*Primary Examiner*—Bruce C. Anderson
*Attorney, Agent, or Firm*—Ratner & Prestia; H. Daniel Schnurmann

[57] ABSTRACT

A charged particle beam apparatus having a cold trap positioned in proximity to components, such as a shaping aperture and a backscattered electrons detector, to which contaminants tend to migrate to adversely affect the functions of these components. As a coolant is passed through the cold trap, the contaminants condense on the cold trap and away from the shaping aperture and the backscattered electrons detector.

10 Claims, 2 Drawing Sheets

CHARGED PARTICLE BEAM APPARATUS HAVING ANTICONTAMINATION MEANS

TECHNICAL FIELD

The present invention relates, in general, to a charged particle beam apparatus and, in particular, to the purification of the atmosphere within such an apparatus.

BACKGROUND OF THE INVENTION

In a charged particle beam apparatus, such as an electron beam lithography unit, a scanning electron microscope, and a transmission electron microscope, the electron beam hits a shaping aperture, the image of which is demagnified and projected onto a target, such as a mask or a wafer. Although the surface of the aperture can be baked out, so that a contaminant, such as an oxide, on the surface of the aperture is cleared prior to use, hydrocarbon gas molecules present in residual gas molecules or from grease at sealed joints are polymerized and deposited on the surface of the aperture which is hit by the electron beam. Such contamination can accumulate to the point that the critical dimensions of the aperture change causing the aperture to be imaged improperly on the target. Charge which builds up on a layer of contamination causes beam deflection resulting in a positioning error.

Many efforts have been made to protect against the accumulation of contaminants on the surface of the aperture. None of the many efforts appear, however, to have solved the problem to the extent desired. Therefore, a need remains for an improved charged particle beam apparatus having structure preventing contamination.

SUMMARY OF THE INVENTION

To meet this and other needs, and in view of its purposes, the present invention provides a charged particle beam apparatus including a source of an electron beam which passes from the source to a target, a shaping aperture through which the electron beam passes to project the image of the shaping aperture on the target, and a demagnifying lens positioned between the shaping aperture and the target and through which the electron beam passes. The charged particle beam apparatus, constructed in accordance with the present invention, also includes a cold trap positioned between the electron beam source and the shaping aperture in proximity to the shaping aperture and through which the electron beam passes.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1:
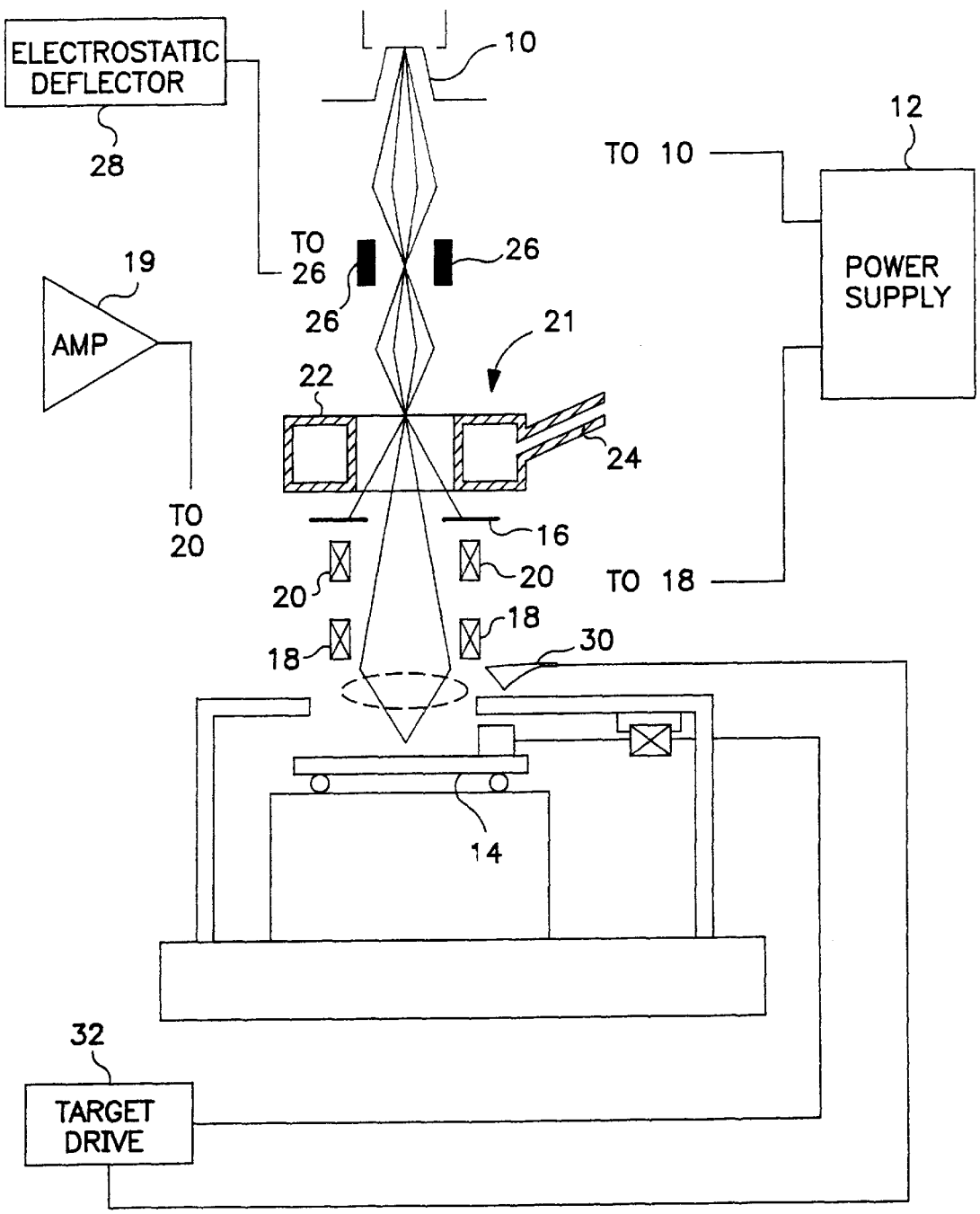
FIG. 1 is a schematic diagram of a first embodiment of the charged particle beam apparatus constructed in accordance with the present invention.

Referring to FIG. 1, the charged particle beam apparatus, constructed in accordance with the present invention, includes a source of an electron beam, such as in a conventional electron beam lithography unit, identified by reference numeral 10. Source 10 is powered by a power supply 12 to develop the electron beam which passes from the source to a target 14, for example a mask or a wafer.

The charged particle beam apparatus, constructed in accordance with the present invention, also includes a shaping aperture 16 through which the electron beam passes. The image of shaping aperture 16 is projected on target 14 to carry out the desired operation in the usual way.

The charged particle beam apparatus, constructed in accordance with the present invention, further includes a demagnifying lens 18 positioned between shaping aperture 16 and target 14 and through which the electron beam passes. It will be understood that additional demagnifying lenses can be included depending upon the design and application of the charged particle beam apparatus. Demagnifying lens 18 is driven by power supply 12. A deflection amplifier 19 drives deflection coils 20 commonly found in a charged particle beam apparatus.

The charged particle beam apparatus, constructed in accordance with the present invention, also includes a cold trap 21 positioned between electron beam source 10 and shaping aperture 16 in proximity to the shaping aperture 16 and through which the electron beam passes. For the embodiment of the present invention being described and illustrated in FIG. 1, cold trap 21 includes a circular tubular ring 22, which surrounds shaping aperture 16, and a supply line 24. Preferably, circular tubular ring 22 is formed from a thermally conductive ceramic material, in which eddy currents are not induced, rather than from a metal in which eddy currents would be induced because of the proximity of the circular tubular ring 22 to deflection coils 20. The otherwise non-electrically conductive ceramic material cold trap is provided with a thin, continuous layer of a noble metal over its entire surface which is normally grounded to drain off charge that may form during operation of the charged particle beam apparatus of the prsent invention.

Supply line 24 of cold trap 21 leads to a supply of a coolant and serves as a mechanism for supplying a coolant to circular tubular ring 22. The coolant can be a cold or liquified gas, for example liquid nitrogen. As coolant passes through circular tubular ring 22, contaminating materials condense on the circular tubular ring 22 and away from shaping aperture 16. As a result, shaping aperture 16 remains clean and does not suffer from the detrimental effects of contamination.

It should be noted that if the charged particle beam apparatus is arranged with more than one shaping aperture 16, each shaping aperture 16 preferably has an associated cold trap 21.

Preferably, the charged particle beam apparatus, constructed in accordance with the present invention, includes a pair of beam blanking plates 26 which are commonly found in a charged particle beam apparatus. Beam blanking plates 26 are driven by an electrostatic deflector 28 to selectively deflect the electron beam away from shaping aperture 16, in effect, turning the electron beam "ON" and "OFF" with respect to target 14.

The charged particle beam apparatus, constructed in accordance with the present invention, preferably also includes a backscattered electrons detector 30 positioned between demagnifying lens 18 and target 14 in proximity to the target 14 and past which the electron beam passes. Backscattered electrons detector 30 typically is an arrangement of diodes which detects electrons which are backscattered from target 14 and develops signals which are processed by a target drive 32 which, in turn, aligns the target 14 in response to the signals developed by the backscattered electrons detector 30.

Figure 2:
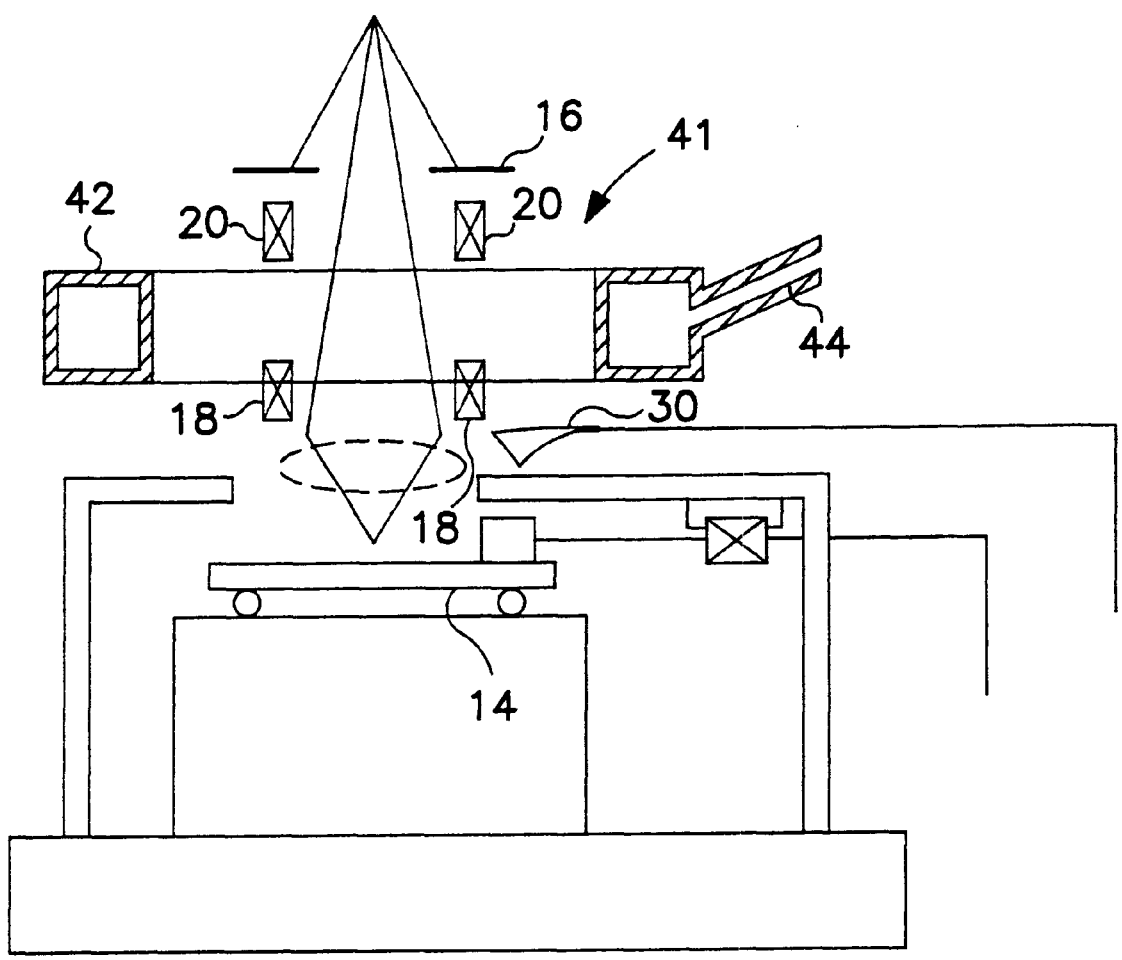
FIG. 2 is a schematic diagram of a portion of a second embodiment of the charged particle beam apparatus constructed in accordance with the present invention.

Referring to FIG. 2, which is a schematic diagram of a portion of a second embodiment of the charged particle beam apparatus constructed in accordance with the present invention, this embodiment of the invention is generally similar to the embodiment illustrated in FIG. 1 with the addition of a second cold trap 41 positioned between shaping aperture 16 and backscattered electrons detector 30 in proximity to the backscattered electrons detector 30 and past which the electron beam passes. As in the first embodiment of the present invention illustrated in FIG. 1, second cold trap 41 includes a second circular tubular ring 42, which surrounds backscattered electrons detector 30, and a supply line 44 through which a coolant, such as liquid nitrogen, is supplied to the second circular tubular ring 42. As coolant passes through circular tubular ring 42, contaminating materials condense on the circular tubular ring 42 and away from backscattered electrons detector 30. As a result, backscattered electrons detector 30 remains clean and does not suffer from the detrimental effects of contamination.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A charged particle beam apparatus interacting with a target and comprising:
    a source of an electron beam which passes from said source to the target;
    a shaping aperture through which the electron beam passes to project the image of said shaping aperture on the target;
    a demagnifying lens positioned between said shaping aperture and the target and through which the electron beam passes; and
    a cold trap positioned between said electron beam source and said shaping aperture in proximity to said shaping aperture and through which the electron beam passes.

2. The charged particle beam apparatus according to claim 1 wherein said cold trap includes:
    (a) a circular tubular ring surrounding said shaping aperture; and
    (b) means for supplying a coolant to said circular tubular ring.

3. The charged particle beam apparatus according to claim 2 wherein said coolant is liquid nitrogen.

4. The charged particle beam apparatus according to claim 2 wherein said circular tubular ring is formed from a thermally conductive ceramic material.

5. The charged particle beam apparatus according to claim 4 wherein said circular tubular ring is coated with a noble metal layer over its surface.

6. A charged particle beam apparatus interacting with a target and comprising:
    a source of an electron beam which passes from said source to the target;
    a shaping aperture through which the electron beam passes to project the image of said shaping aperture on the target;
    a demagnifying lens positioned between said shaping aperture and the target and through which the electron beam passes;
    a first cold trap positioned between said electron beam source and said shaping aperture in proximity to said shaping aperture and through which the electron beam passes;
    a backscattered electrons detector positioned between said demagnifying lens and the target in proximity to the target and past which the electron beam passes; and
    a second cold trap positioned between said shaping aperture and said backscattered electrons detector in proximity to said backscattered electrons detector.

7. The charged particle beam apparatus according to claim 6 wherein:
    (a) said first cold trap includes:
        (1) a first circular tubular ring surrounding said shaping aperture, and
        (2) means for supplying a coolant to said first circular tubular ring; and
    (b) said second cold trap includes:
        (1) a second circular tubular ring surrounding said backscattered electrons detector, and
        (2) means for supplying a coolant to said second circular tubular ring.

8. The charged particle beam apparatus according to claim 7 wherein said coolant supplied to said circular tubular rings is liquid nitrogen.

9. The charged particle beam apparatus according to claim 8 wherein each of said first circular tubular ring and said second circular tubular ring is formed from a thermally conductive ceramic material.

10. The charged particle beam apparatus according to claim 9 wherein each of said first circular tubular ring and said second circular tubular ring is coated with a noble metal layer over its surface.

* * * * *